(12) United States Patent
Feng

(10) Patent No.: US 11,264,407 B2
(45) Date of Patent: Mar. 1, 2022

(54) ARRAY SUBSTRATE

(71) Applicant: WUHAN CHINA STAR OPTOELECTRONICS SEMICONDUCTOR DISPLAY TECHNOLOGY CO., LTD., Wuhan (CN)

(72) Inventor: Xiaoliang Feng, Wuhan (CN)

( * ) Notice: Subject to any disclaimer, the term of this patent is extended or adjusted under 35 U.S.C. 154(b) by 271 days.

(21) Appl. No.: 16/343,778

(22) PCT Filed: Dec. 21, 2018

(86) PCT No.: PCT/CN2018/122899
§ 371 (c)(1),
(2) Date: Apr. 22, 2019

(87) PCT Pub. No.: WO2020/118759
PCT Pub. Date: Jun. 18, 2020

(65) Prior Publication Data
US 2021/0183893 A1    Jun. 17, 2021

(30) Foreign Application Priority Data

Dec. 10, 2018 (CN) .......................... 201811505975.4

(51) Int. Cl.
*H01L 27/12* (2006.01)
*H01L 23/00* (2006.01)
(Continued)

(52) U.S. Cl.
CPC ............ *H01L 27/124* (2013.01); *H01L 24/05* (2013.01); *G02F 1/13458* (2013.01);
(Continued)

(58) Field of Classification Search
CPC ....... H01L 27/124; H01L 24/05; H01L 24/06; H01L 22/14; H01L 51/5237; H01L 22/32;
(Continued)

(56) References Cited

U.S. PATENT DOCUMENTS

2008/0017855 A1* 1/2008 Kim ...................... G02F 1/1309
257/48
2008/0137021 A1* 6/2008 Choi ..................... G02F 1/1345
349/150
(Continued)

*Primary Examiner* — Mouloucoulaye Inoussa

(57) ABSTRACT

An array substrate including a substrate, a plurality of fan-out traces and a plurality of bonding terminals. The substrate includes a display area and a non-display area surrounding the display area. The fan-out traces and the bonding terminals are disposed in the non-display area. The bonding terminals are spaced apart from each other. First ends of the fan-out traces are respectively electrically connected to the bonding terminals. Second ends of the fan-out traces are electrically connected to the display area. The fan-out traces include a plurality of first fan-out traces and a plurality of second fan-out traces. The first fan-out traces are formed by a first metal layer. The second fan-out traces are formed by a second metal layer. An insulating layer is provided between the first metal layer and the second metal layer. The first fan-out traces and the second fan-out traces are partially overlapped.

10 Claims, 5 Drawing Sheets

(51) Int. Cl.
*G02F 1/1362* (2006.01)
*G02F 1/1345* (2006.01)

(52) U.S. Cl.
CPC .......... *G02F 1/13629* (2021.01); *H01L 24/06* (2013.01); *H01L 2224/05541* (2013.01); *H01L 2224/06155* (2013.01)

(58) Field of Classification Search
CPC ............ H01L 27/3276; H01L 51/0097; H01L 51/0024; H01L 27/1259; H01L 51/56; H01L 51/0031; H01L 27/3262; H01L 27/323; H01L 33/48; H01L 33/08; G09G 3/006; G09G 3/3225; Y02E 10/549; G06F 3/0416; G06F 3/044; G06F 3/0412; G06F 3/041; G06F 3/0446; G06F 3/0443; H03K 17/9622; H05K 1/118; G02F 1/1345; G02F 1/136254

USPC ............ 257/48, 59, 270, 88; 438/18, 30, 15; 345/173, 98, 174; 349/150, 152, 192
See application file for complete search history.

(56) References Cited

U.S. PATENT DOCUMENTS

| | | | | |
|---|---|---|---|---|
| 2013/0106747 | A1* | 5/2013 | Choi | G06F 3/0443 345/173 |
| 2013/0120231 | A1* | 5/2013 | Jo | G02F 1/13452 345/98 |
| 2013/0270582 | A1* | 10/2013 | Shin | H01L 33/48 257/88 |
| 2016/0103537 | A1* | 4/2016 | Park | G06F 3/0443 345/174 |
| 2016/0349565 | A1* | 12/2016 | Kim | G02F 1/13306 |
| 2016/0351093 | A1* | 12/2016 | Kim | G09G 3/2092 |
| 2017/0364194 | A1* | 12/2017 | Jang | H01L 27/3262 |
| 2018/0033354 | A1* | 2/2018 | Lee | G09G 3/006 |

* cited by examiner

ARRAY SUBSTRATE

CROSS REFERENCE TO RELATED APPLICATIONS

This application claims the priority of International Application No. PCT/CN2018/122899, filed on Dec. 21, 2018, which claims priority to Chinese Application No. 201811505975.4, filed on Dec. 10, 2018. The entire disclosures of the above applications are incorporated herein by reference.

FIELD OF INVENTION

The present invention generally relates to the display technology and, more particularly, to an array substrate.

BACKGROUND OF INVENTION

With the development of the display technology, flat-panel displays (FPDs) such as liquid crystal displays (LCDs) are widely used in various consumer electronic products such as mobile phones, televisions, personal digital assistants, digital cameras, notebook computers and desktop computers due to their advantages such as high image quality, power saving, thin body and wide application range, and thus have become the mainstream among display devices.

Most of the LCD devices on the market are backlight-type, which include an LCD panel and a backlight module. The operation principle of an LCD panel uses liquid crystal (LC) molecules sandwiched between two parallel glass substrates. There are many vertical and horizontal thin wires between the two glass substrates. The orientation of the LC molecules is determined by controlling the voltage applied across the LC molecules to refract the light from the backlight module to produce a picture.

The conventional LCD panel generally includes a color filter (CF), a thin-film transistor (TFT) array substrate, LC molecules sandwiched between the color filter and the array substrate, and a sealant. The structure of the conventional array substrate is as shown in FIG. 1, which includes a substrate 10, a plurality of scanning lines 20, a plurality of data lines 30, a plurality of fan-out traces 40, and a plurality of bonding terminals 50. The substrate 10 includes a display area 110 and a non-display area 120 surrounding the display area 110. The plurality of scanning lines 20 is spaced apart from each other along the vertical direction and extends along the horizontal direction in the display area 110. The plurality of data lines 30 is spaced apart from each other along the horizontal direction and extends along the vertical direction in the display area 110. The plurality of fan-out traces 40 and the plurality of bonding terminals 50 are disposed in the non-display area 120. The plurality of bonding terminals 50 is disposed on the upper side of the display area 110. The odd-numbered rows of scanning lines 20 are electrically connected to the bonding terminals 50 through the fan-out traces 40 disposed on the left side of the display area 110, and the even-numbered rows of scanning lines 20 are electrically connected to the bonding terminals 50 through the fan-out traces 40 disposed on the right side of the display area 110. The data lines 30 are electrically connected to the bonding terminals 50 through the fan-out traces 40 disposed on the upper side of the display area 110. In this structure, the fan-out traces 40 electrically connected to the scanning lines 20 are distributed on the left and right sides of the display area 110. All the fan-out traces 40 on the array substrate are formed by the same metal layer, which occupies a large amount of layout space and is not conducive to the implementation of a narrow bezel panel display.

SUMMARY OF INVENTION

It is one object of the present invention to provide an array substrate, capable of significantly reducing the bezel size of a display panel and improving the product quality.

To achieve the foregoing object, the present invention provides an array substrate including a substrate, a plurality of fan-out traces, and a plurality of bonding terminals.

The substrate includes a display area and a non-display area surrounding the display area. The plurality of fan-out traces and the plurality of bonding terminals are disposed in the non-display area. The plurality of bonding terminals is spaced apart from each other. First ends of the plurality of fan-out traces are respectively electrically connected to the plurality of bonding terminals. Second ends of the plurality of fan-out traces are electrically connected to the display area.

The plurality of fan-out traces includes a plurality of first fan-out traces and a plurality of second fan-out traces. The plurality of first fan-out traces is formed by a first metal layer. The plurality of second fan-out traces is formed by a second metal layer. An insulating layer is provided between the first metal layer and the second metal layer. The plurality of first fan-out traces and the plurality of second fan-out traces are partially overlapped.

The display area is provided therein with a plurality of data lines being parallel and spaced apart from each other and a plurality of scanning lines being parallel and spaced apart from each other and intersecting the plurality of data lines. Each of the plurality of data lines is electrically connected to a corresponding one of the plurality of bonding terminals through one of the plurality of fan-out traces. Each of the plurality of scanning lines is electrically connected to a corresponding one of the plurality of bonding terminals through one of the plurality of fan-out traces.

The plurality of scanning lines includes a plurality of first scanning lines and a plurality of second scanning lines. The plurality of first scanning lines is alternately arranged with the plurality of second scanning lines.

A first fan-out trace and a second fan-out trace partially overlapped with the first fan-out trace are provided corresponding to two adjacent data lines respectively. One of the two adjacent data lines is electrically connected to a bonding terminal corresponding thereto through the first fan-out trace, and the other one of the two adjacent data lines is electrically connected to a bonding terminal corresponding thereto through the second fan-out trace.

A first fan-out trace and a second fan-out trace partially overlapped with the first fan-out trace are provided corresponding to two adjacent first scanning lines respectively. One of the two adjacent first scanning lines is electrically connected to a bonding terminal corresponding thereto through the first fan-out trace, and the other one of the two adjacent first scanning lines is electrically connected to a bonding terminal corresponding thereto through the second fan-out trace.

A first fan-out trace and a second fan-out trace partially overlapped with the first fan-out trace are provided corresponding to two adjacent second scanning lines respectively. One of the two adjacent second scanning lines is electrically connected to a bonding terminal corresponding thereto through the first fan-out trace, and the other one of the two adjacent second scanning lines is electrically connected to a bonding terminal corresponding thereto through the second fan-out trace.

The plurality of scanning lines extends along a first direction. The plurality of data lines extends along a second direction perpendicular to the first direction. The non-display area includes a first layout area and a second layout area disposed along the first direction and a third layout area and a fourth layout area disposed along the second direction.

The plurality of bonding terminals and the fan-out traces connecting the data lines and the bonding terminals are disposed in the first layout area. The fan-out traces connecting the first scanning lines and the bonding terminals extend from the third layout area into the first layout area. The fan-out traces connecting the second scanning lines and the bonding terminals extend from the fourth layout area into the first layout area.

The plurality of bonding terminals is formed by the second metal layer. The plurality of first fan-out traces is electrically connected to the plurality of bonding terminals corresponding thereto through first through holes penetrating the insulating layer.

The plurality of data lines is formed by the second metal layer. The plurality of first fan-out traces is electrically connected to the plurality of data lines corresponding thereto through second through holes penetrating the insulating layer.

The plurality of scanning lines is formed by the first metal layer. The plurality of second fan-out traces is electrically connected to the plurality of scanning lines corresponding thereto through third through holes penetrating the insulating layer.

The plurality of data lines and the plurality of scanning lines intersect to define a plurality of pixel regions arranged in an array. Each of the plurality of pixel regions is provided therein with a switching thin-film transistor and a pixel electrode. The gate of the switching thin-film transistor is electrically connected to a scanning line corresponding thereto. The source of the switching thin-film transistor is electrically connected to a data line corresponding thereto. The drain of the switching thin-film transistor is electrically connected to the pixel electrode in the same pixel region.

One advantageous effect of the present invention is that the present invention provides an array substrate including a substrate, a plurality of fan-out traces and a plurality of bonding terminals. The substrate includes a display area and a non-display area surrounding the display area. The plurality of fan-out traces and the plurality of bonding terminals are disposed in the non-display area. The plurality of bonding terminals is spaced apart from each other. First ends of the plurality of fan-out traces are respectively electrically connected to the plurality of bonding terminals. Second ends of the plurality of fan-out traces are electrically connected to the display area. The plurality of fan-out traces includes a plurality of first fan-out traces and a plurality of second fan-out traces. The plurality of first fan-out traces is formed by a first metal layer. The plurality of second fan-out traces is formed by a second metal layer. An insulating layer is provided between the first metal layer and the second metal layer. The plurality of first fan-out traces and the plurality of second fan-out traces are partially overlapped. The fan-out traces are distributed in the first metal layer and the second metal layer to reduce the layout area of the fan-out traces and the bezel width of the display panel to achieve a narrow bezel display.

DESCRIPTION OF DRAWINGS

To better understand the features and technical aspects of the present invention, reference should be made to the accompanying drawings provided for the purposes of illustration and description only and never intended to be limit the present invention, wherein.

DETAILED DESCRIPTION OF PREFERRED EMBODIMENTS

Figure 1:
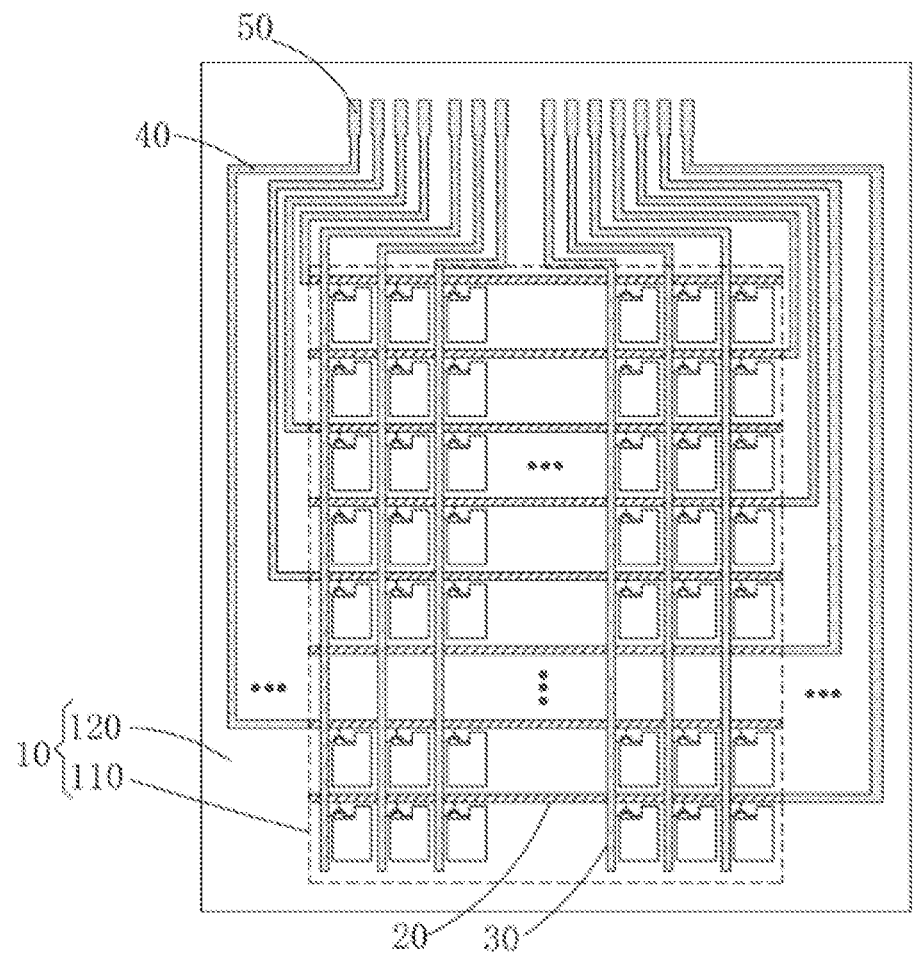
FIG. 1 is a schematic view of a conventional array substrate.

In order to further clarify the technical means and effects of the present invention, the detailed description herein will be made in conjunction with the preferred embodiments of the present invention and the accompanying drawings.

Referring to FIG. 2 to FIG. 7, the present invention provides an array substrate including a substrate 1, a plurality of fan-out traces 2 and a plurality of bonding terminals 3.

The substrate 1 includes a display area 11 and a non-display area 12 surrounding the display area 11. The plurality of fan-out traces 2 and the plurality of bonding terminals 3 are disposed in the non-display area 12. The plurality of bonding terminals 3 is spaced apart from each other. First ends of the plurality of fan-out traces 2 are respectively electrically connected to the plurality of bonding terminals 3. Second ends of the plurality of fan-out traces 2 are electrically connected to the display area 11.

The plurality of fan-out traces 2 includes a plurality of first fan-out traces 21 and a plurality of second fan-out traces 22. The plurality of first fan-out traces 21 is formed by a first metal layer. The plurality of second fan-out traces 22 is formed by a second metal layer. An insulating layer 4 is provided between the first metal layer and the second metal layer. The plurality of first fan-out traces 21 and the plurality of second fan-out traces 22 are partially overlapped.

Figure 2:
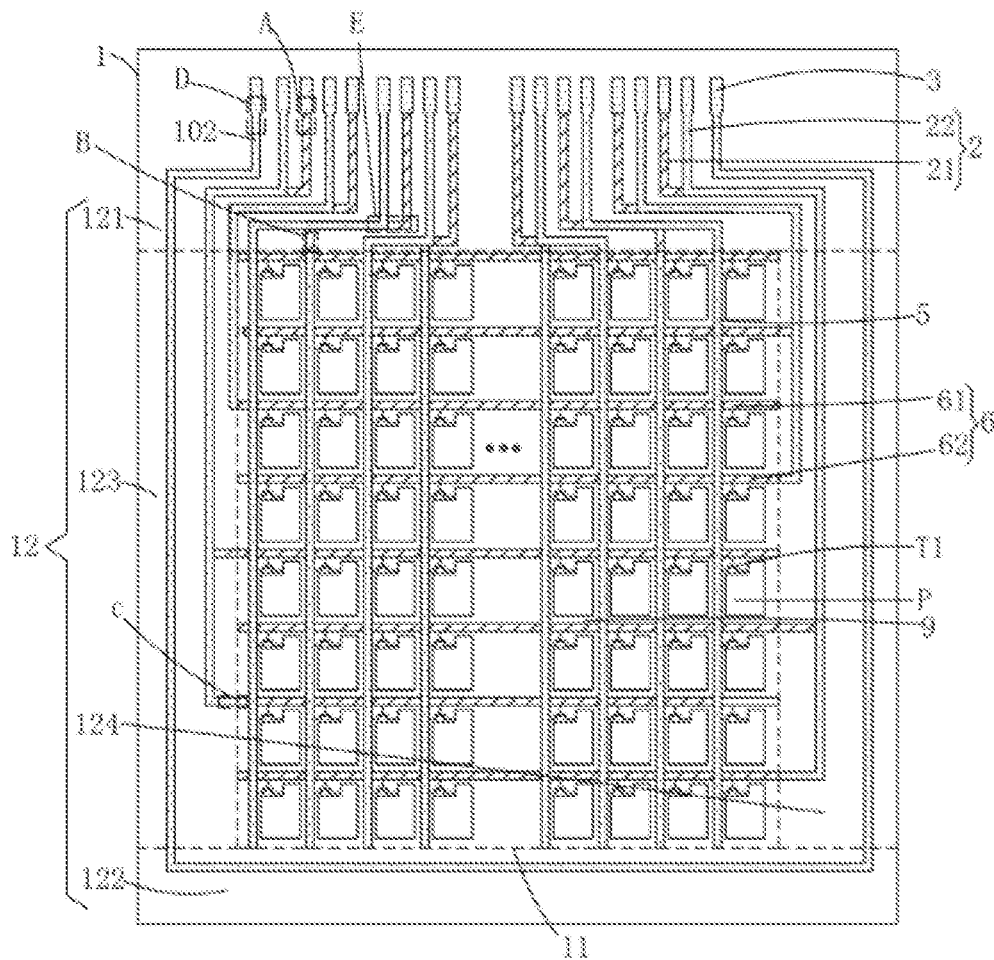
FIG. 2 is a schematic view of an array substrate of the present invention.

More particularly, as shown in FIG. 2, the display area 11 is provided therein with a plurality of data lines 5 being parallel and spaced apart from each other and a plurality of scanning lines 6 being parallel and spaced apart from each other and intersecting the plurality of data lines 5. Each of the plurality of data lines 5 is electrically connected to a corresponding one of the plurality of bonding terminals 3 through one of the plurality of fan-out traces 2. Each of the plurality of scanning lines 6 is electrically connected to a corresponding one of the plurality of bonding terminals 3 through one of the plurality of fan-out traces 2.

More particularly, the plurality of scanning lines 6 includes a plurality of first scanning lines 61 and a plurality of second scanning lines 62. The plurality of first scanning lines 61 is alternately arranged with the plurality of second scanning lines 62.

Furthermore, the plurality of data lines 5 and the plurality of scanning lines 6 intersect to define a plurality of pixel regions 9 arranged in an array. Each of the plurality of pixel regions 9 is provided therein with a switching thin-film transistor T1 and a pixel electrode P. The gate of the switching thin-film transistor T1 is electrically connected to a scanning line 6 corresponding thereto. The source of the switching thin-film transistor T1 is electrically connected to a data line 5 corresponding thereto. The drain of the switching thin-film transistor T1 is electrically connected to the pixel electrode P in the same pixel region 9. More particularly, as shown in FIG. 2, the gate of each of the switching thin-film transistors T1 is correspondingly electrically connected to a scanning line 6 disposed there above. The source of each switching thin-film transistor T1 is correspondingly electrically connected to a data line 5 disposed on the left side.

More particularly, the gate of the switching thin-film transistor T1 is formed by the first metal layer, while the source and the drain are formed by the second metal layer. The pixel electrode P is formed by the transparent electrode layer above the second metal layer. A passivation layer is provided between the transparent electrode layer and the second metal layer. The pixel electrode P is electrically connected to the drain of the switching thin-film transistor T1 through a through hole penetrating the passivation layer. In other words, the film layers of the array substrate are, from bottom to top, the first metal layer, the insulating layer, the second metal layer, the passivation layer, and the transparent electrode layer sequentially disposed.

Figure 3:
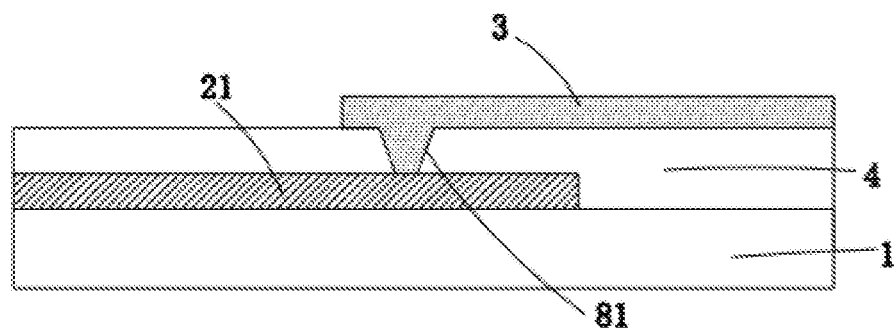
FIG. 3 is a cross-sectional view taken at A in FIG. 2.
Figure 4:
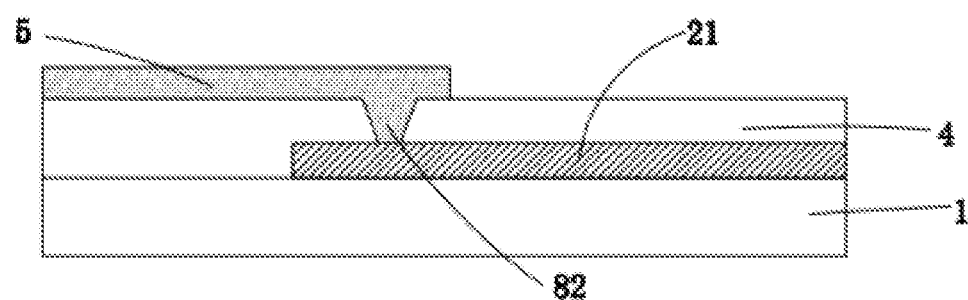
FIG. 4 is a cross-sectional view taken at B in FIG. 2.

Furthermore, as shown in FIG. 3 and FIG. 4, the plurality of bonding terminals 3 and the plurality of data lines 5 are formed by the second metal layer. The first fan-out trace 21 is electrically connected to a bonding terminal 3 corresponding thereto through a first through hole 81 penetrating the passivation layer 4. The first fan-out trace 21 is electrically connected to a data line 5 corresponding thereto through a second through hole 82 penetrating the passivation layer 4.

Figure 5:
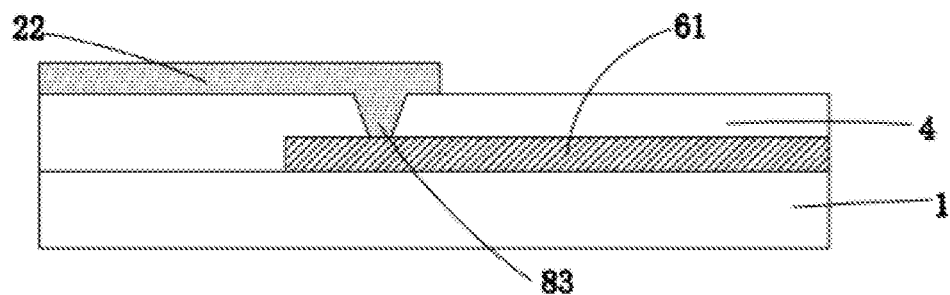
FIG. 5 is a cross-sectional view taken at C in FIG. 2.

More particularly, as shown in FIG. 5, the plurality of scanning lines 6 is formed by the first metal layer, the second fan-out trace 2 is electrically connected to a scanning line 6 corresponding thereto through a third through hole 83 penetrating the passivation layer 4.

Figure 6:
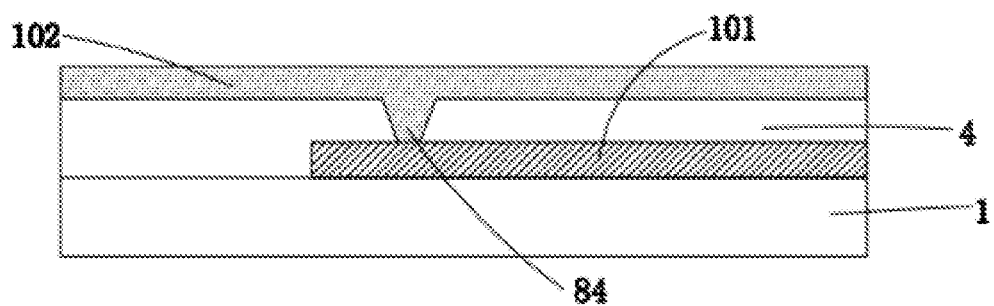
FIG. 6 is a cross-sectional view taken at D in FIG. 2.

Furthermore, as shown in FIG. 6, in order to prevent electrostatic breakdown, the array substrate of the present invention further includes a first ground wire 101 and a second ground wire 102 disposed around the display area 11. The second ground wire 102 is formed by the second metal layer. Both ends of the second ground wire 102 are electrically connected to a bonding terminal 3, respectively. The first ground wire 101 is formed by the first metal layer. The first ground wire 101 is electrically connected to the second ground wire 102 through a fourth through hole 84 penetrating the passivation layer 4.

Figure 7:
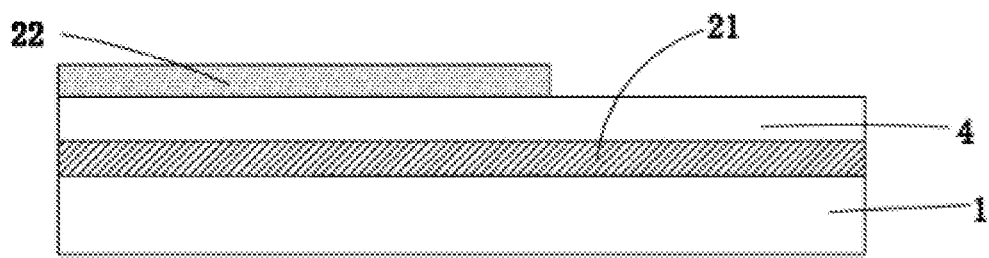
FIG. 7 is a cross-sectional view taken at E in FIG. 2.

More particularly, as shown in FIG. 2 in conjunction with FIG. 7, in the embodiment of the present invention, a first fan-out trace 21 and a second fan-out trace 22 partially overlapped with the first fan-out trace 21 are provided corresponding to two adjacent data lines 5, respectively. One of the two adjacent data lines 5 is electrically connected to a bonding terminal 3 corresponding thereto through the first fan-out trace 21, and the other one of the two adjacent data lines 5 is electrically connected to a bonding terminal 3 corresponding thereto through the second fan-out trace 22.

A first fan-out trace 21 and a second fan-out trace 22 partially overlapped with the first fan-out trace 21 are provided corresponding to two adjacent first scanning lines 61, respectively. One of the two adjacent first scanning lines 61 is electrically connected to a bonding terminal 3 corresponding thereto through the first fan-out trace 21, and the other one of the two adjacent first scanning lines 61 is electrically connected to a bonding terminal 3 corresponding thereto through the second fan-out trace 22.

A first fan-out trace 21 and a second fan-out trace 22 partially overlapped with the first fan-out trace 21 are provided corresponding to two adjacent second scanning lines 62, respectively. One of the two adjacent second scanning lines 62 is electrically connected to a bonding terminal 3 corresponding thereto through the first fan-out trace 21, and the other one of the two adjacent second scanning lines 62 is electrically connected to a bonding terminal 3 corresponding thereto through the second fan-out trace 22.

Furthermore, the plurality of scanning lines 6 extends along a first direction. The plurality of data lines 5 extends along a second direction perpendicular to the first direction. The non-display area includes 12 a first layout area 121 and a second layout area 122 disposed along the first direction and a third layout area 123 and a fourth layout area 124 disposed along the second direction.

The plurality of bonding terminals 3 and the fan-out traces 2 connecting the data lines 5 and the bonding terminals 3 are disposed in the first layout area 121. The fan-out traces 2 connecting the first scanning lines 61 and the bonding terminals 3 extend from the third layout area 123 into the first layout area 121. The fan-out traces 2 connecting the second scanning lines 62 and the bonding terminals 3 extend from the fourth layout area 124 into the first layout area 121.

In detail, as shown in FIG. 2, in the embodiment of the present invention, the odd-numbered rows of scanning lines 6 are the first scanning lines 61, and the even-numbered rows of scanning lines 6 are the second scanning lines 62. The first layout area 121, the second layout area 122, the third layout area 123 and the fourth layout area 124 are disposed on the upper side, the lower side, the left side, and the right side of the display area 11, respectively. More particularly, the fan-out traces 2 corresponding to the first scanning lines 61 are disposed at the left end, the fan-out traces 2 corresponding to the second scanning lines 62 are disposed at the right end, and the fan-out traces 2 corresponding to the data lines 5 are disposed at the upper end.

For example, as shown in FIG. 2, the scanning line 6 on the first row is provided with a first fan-out trace 21, and the scanning line 6 on the third row is provided with a second fan-out trace 22. The first fan-out trace 21 and the second fan-out trace 22 extend upward from the left ends of the scanning line 6 on the first row and the scanning line 6 on the third row, respectively. The second fan-out trace 22 is overlapped with the first fan-out trace 21 after extending beyond the scanning line 6 on the first row. After extending into the first layout area 121, the second fan-out trace 22 turns right and extends horizontally and remains overlapped with the first fan-out trace 21 until reaching the lower side of the corresponding bonding terminals 3. The first fan-out trace 21 and the second fan-out trace 22 turn up again, respectively, and extend to be electrically connected to the corresponding bonding terminals 3. Similarly, the scanning line 6 on the second row is provided with a first fan-out trace 21, and the scanning line 6 on the fourth row is provided with a second fan-out trace 22.

For example, as shown in FIG. 2, the data line 5 on the first column and the data line 5 on the second column are respectively provided with a second fan-out trace 22 and a first fan-out trace 21. The second fan-out trace 22 and the first fan-out trace 21 are led out from the upper ends of the data line 5 on the first column and the data line 5 on the second column, respectively. The second fan-out trace 22 and the first fan-out trace 21 turn right and become partially overlapped to extend horizontally until reaching the lower side of the corresponding bonding terminals 3. The second fan-out trace 22 and the first fan-out trace 21 turn up and extend to be electrically connected to the corresponding bonding terminals 3, respectively.

By comparing FIG. 1 and FIG. 2, in the array substrate of the present invention, the fan-out traces 2 disposed on the left side of the display area 11 are overlapped in pairs, which reducing the required space by half. In addition, the fan-out traces 2 disposed on the upper side of the display area 11 are also overlapped in pairs, which reducing the required space by half. Furthermore, the fan-out traces 2 disposed on the right side of the display area 11 are also overlapped in pairs, which reducing the required space by half. Consequently, the array substrate of the present invention, compared with the prior art, can be used to reduce the bezel width on the upper side, the left side and the right side by half to achieve a narrow bezel display.

In summary, the present invention provides an array substrate including a substrate, a plurality of fan-out traces and a plurality of bonding terminals. The substrate includes a display area and a non-display area surrounding the display area. The plurality of fan-out traces and the plurality of bonding terminals are disposed in the non-display area. The plurality of bonding terminals is spaced apart from each other. First ends of the plurality of fan-out traces are respectively electrically connected to the plurality of bonding terminals. Second ends of the plurality of fan-out traces are electrically connected to the display area. The plurality of fan-out traces includes a plurality of first fan-out traces and a plurality of second fan-out traces. The plurality of first fan-out traces is formed by a first metal layer. The plurality of second fan-out traces is formed by a second metal layer. An insulating layer is provided between the first metal layer and the second metal layer. The plurality of first fan-out traces and the plurality of second fan-out traces are partially overlapped. The fan-out traces are distributed in the first metal layer and the second metal layer to reduce the layout area of the fan-out traces and the bezel width of the display panel to achieve a narrow bezel display.

In view of the above, various alterations and modifications may be made based on the technical aspects and technical conceptions of the present invention by those with ordinary skill in the art, and all such alterations and modifications are intended to fall within the scope of the present invention.

What is claimed is:

1. An array substrate, comprising: a substrate, a plurality of fan-out traces and a plurality of bonding terminals;
    the substrate comprising a display area and a non-display area surrounding the display area, the display area is provided therein with a plurality of data lines being parallel and spaced apart from each other, the plurality of fan-out traces and the plurality of bonding terminals being disposed in the non-display area, the plurality of bonding terminals being spaced apart from each other, first ends of the plurality of fan-out traces being respectively electrically connected to the plurality of bonding terminals, and second ends of the plurality of fan-out traces being electrically connected to the display area; and
    the plurality of fan-out traces comprising a plurality of first fan-out traces and a plurality of second fan-out traces, the plurality of first fan-out traces being formed by a first metal layer, the plurality of second fan-out traces being formed by a second metal layer, an insulating layer being provided between the first metal layer and the second metal layer, and the plurality of first fan-out traces and the plurality of second fan-out traces being partially overlapped between adjacent ones of the plurality of data lines.

2. The array substrate of claim 1, wherein a plurality of scanning lines being parallel and spaced apart from each other and intersecting the plurality of data lines, each of the plurality of data lines being electrically connected to a corresponding one of the plurality of bonding terminals through one of the plurality of fan-out traces, and each of the plurality of scanning lines being electrically connected to a corresponding one of the plurality of bonding terminals through one of the plurality of fan-out traces;
    the plurality of scanning lines comprising a plurality of first scanning lines and a plurality of second scanning lines, and the plurality of first scanning lines being alternately arranged with the plurality of second scanning lines.

3. The array substrate of claim 2, wherein a first fan-out trace and a second fan-out trace partially overlapped with the first fan-out trace are provided corresponding to two adjacent data lines respectively, one of the two adjacent data lines being electrically connected to a bonding terminal corresponding thereto through the first fan-out trace, and the other one of the two adjacent data lines being electrically connected to a bonding terminal corresponding thereto through the second fan-out trace.

4. The array substrate of claim 2, wherein a first fan-out trace and a second fan-out trace partially overlapped with the first fan-out trace are provided corresponding to two adjacent first scanning lines respectively, one of the two adjacent first scanning lines being electrically connected to a bonding terminal corresponding thereto through the first fan-out trace, and the other one of the two adjacent first scanning lines being electrically connected to a bonding terminal corresponding thereto through the second fan-out trace.

5. The array substrate of claim 2, wherein a first fan-out trace and a second fan-out trace partially overlapped with the first fan-out trace are provided corresponding to two adjacent second scanning lines respectively, one of the two adjacent second scanning lines being electrically connected to a bonding terminal corresponding thereto through the first fan-out trace, and the other one of the two adjacent second scanning lines being electrically connected to a bonding terminal corresponding thereto through the second fan-out trace.

6. The array substrate of claim 2, wherein the plurality of scanning lines extends along a first direction, the plurality of data lines extends along a second direction perpendicular to the first direction, and the non-display area comprises a first layout area and a second layout area disposed along the first direction and a third layout area and a fourth layout area disposed along the second direction;
    the plurality of bonding terminals and the fan-out traces connecting the data lines and the bonding terminals being disposed in the first layout area, the fan-out traces connecting the first scanning lines and the bonding terminals extending from the third layout area into the first layout area, and the fan-out traces connecting the second scanning lines and the bonding terminals extending from the fourth layout area into the first layout area.

7. The array substrate of claim 1, wherein the plurality of bonding terminals is formed by the second metal layer, and the plurality of first fan-out traces is electrically connected to the plurality of bonding terminals corresponding thereto through first through holes penetrating the insulating layer.

8. The array substrate of claim 2, wherein the plurality of data lines is formed by the second metal layer, and the plurality of first fan-out traces is electrically connected to the plurality of data lines corresponding thereto through second through holes penetrating the insulating layer.

9. The array substrate of claim 2, wherein the plurality of scanning lines is formed by the first metal layer, and the plurality of second fan-out traces is electrically connected to the plurality of scanning lines corresponding thereto through third through holes penetrating the insulating layer.

10. The array substrate of claim 2, wherein the plurality of data lines and the plurality of scanning lines intersect to define a plurality of pixel regions arranged in an array, each of the plurality of pixel regions being provided therein with a switching thin-film transistor and a pixel electrode, the gate of the switching thin-film transistor being electrically connected to a scanning line corresponding thereto, the source of the switching thin-film transistor being electrically connected to a data line corresponding thereto, and the drain of the switching thin-film transistor being electrically connected to the pixel electrode in the same pixel region.

* * * * *